(12) United States Patent
Hong (10) Patent No.: US 8,220,992 B2
(45) Date of Patent: Jul. 17, 2012

(54) DIGITAL TEMPERATURE INFORMATION GENERATING APPARATUS FOR SEMICONDUCTOR INTEGRATED CIRCUIT

(75) Inventor: Yun-Seok Hong, Ichon (KR)

(73) Assignee: SK hynix Inc. (KR)

( * ) Notice: Subject to any disclaimer, the term of this patent is extended or adjusted under 35 U.S.C. 154(b) by 1020 days.

(21) Appl. No.: 12/181,886

(22) Filed: Jul. 29, 2008

(65) Prior Publication Data

US 2009/0129439 A1 May 21, 2009

(30) Foreign Application Priority Data

Nov. 19, 2007 (KR) .................. 10-2007-0117941

(51) Int. Cl.
*G01K 7/00* (2006.01)

(52) U.S. Cl. ............... 374/170; 374/163; 365/222

(58) Field of Classification Search .............. 374/163, 374/170–171; 365/191, 222, 233, 211, 233.2; 331/48–49, 74, 176; 702/127, 189, 130–136; 307/115, 117; 327/378, 512–513
See application file for complete search history.

(56) References Cited

U.S. PATENT DOCUMENTS

| | | | | |
|---|---|---|---|---|
| 4,464,067 A * | 8/1984 | Hanaoka | ................ | 374/170 |
| 4,482,261 A * | 11/1984 | Dewey et al. | ................ | 374/181 |
| 5,388,134 A * | 2/1995 | Douglass et al. | ................ | 377/25 |
| 5,495,452 A * | 2/1996 | Cha | ................ | 365/222 |
| 5,638,418 A * | 6/1997 | Douglass et al. | ................ | 377/25 |
| 5,805,403 A * | 9/1998 | Chemla | ................ | 361/103 |
| 5,899,570 A * | 5/1999 | Darmawaskita et al. | ..... | 374/170 |
| 6,695,475 B2 | 2/2004 | Yin | | |
| 6,809,980 B2 * | 10/2004 | Schnabel et al. | ................ | 365/222 |
| 7,266,031 B2 | 9/2007 | Kim et al. | | |
| 7,272,063 B1 | 9/2007 | Egerer et al. | | |
| 7,313,491 B2 * | 12/2007 | Ariav et al. | ................ | 702/75 |
| 7,549,796 B2 * | 6/2009 | Nam et al. | ................ | 374/170 |
| 7,573,340 B2 * | 8/2009 | Lee | ................ | 331/66 |
| 7,594,750 B2 * | 9/2009 | Lee et al. | ................ | 374/178 |
| 7,640,392 B2 * | 12/2009 | Walker | ................ | 711/106 |
| 7,663,897 B2 * | 2/2010 | Horiguchi et al. | ................ | 363/62 |
| 7,705,688 B2 * | 4/2010 | Hong | ................ | 331/176 |
| 7,859,931 B2 * | 12/2010 | Hong et al. | ................ | 365/222 |

FOREIGN PATENT DOCUMENTS

| | | |
|---|---|---|
| JP | 2006-004557 | 1/2006 |
| JP | 2006-114205 | 4/2006 |
| KR | 100656430 B1 | 12/2006 |
| KR | 1020070036642 A | 4/2007 |
| KR | 1020070074938 A | 7/2007 |

* cited by examiner

*Primary Examiner* — Lisa Caputo
*Assistant Examiner* — Tania Courson
(74) *Attorney, Agent, or Firm* — Baker & McKenzie LLP (57) ABSTRACT

A digital temperature information generating apparatus for a semiconductor integrated circuit includes a temperature information generating block that, in response to a reset signal, latches and decodes multiple divided signals obtained by multiple-dividing a second control signal at a timing corresponding to a change in period of a first control signal according to a temperature, and generates temperature information, and pads through which the generated temperature information is output.

20 Claims, 8 Drawing Sheets

DIGITAL TEMPERATURE INFORMATION GENERATING APPARATUS FOR SEMICONDUCTOR INTEGRATED CIRCUIT

CROSS-REFERENCE TO RELATED PATENT APPLICATION

This application claims the benefit under 35 U.S.C. 119(a) of Korean Patent Application No. 10-2007-0117941, filed on Nov. 19, 2007, in the Korean Intellectual Property Office, the disclosure of which is incorporated herein in its entirety by reference as if set forth in full.

BACKGROUND

1. Technical Field

The embodiments described herein relate to a semiconductor integrated circuit, and in particular, to a digital temperature information generating apparatus for a semiconductor integrated circuit.

2. Related Art

In a semiconductor memory apparatus that writes data into a memory cell and outputs data written in the memory cell, an operation mode, called refresh, is necessarily performed to prevent data written in the memory cell from being lost. The refresh operation is divided into a self refresh operation, which is performed in the semiconductor memory apparatus itself, and an auto refresh operation, which is performed according to an external command.

The self refresh is cyclically performed in the semiconductor memory apparatus. Accordingly, the semiconductor memory apparatus needs a period signal for determining the timing of the self refresh operation. The period signal is also referred to as a self refresh signal, and is generated in the semiconductor memory apparatus.

To increase the efficiency of the self refresh operation, the period of the self refresh signal can be varied according to an ambient temperature.

An auto refresh operation also needs temperature information in order to vary the period of the auto refresh signal according to the ambient temperature. The JEDEC (Joint Electron Device Engineering Council) Mobile DRAM Standards define a refresh rate according to temperature information that is output through pads DQ8 to DQ10 of the DRAM.

At present, however, there is no hardware and software solution that allows the semiconductor integrated circuit to provide the temperature information.

SUMMARY

A digital temperature information generating apparatus for a semiconductor integrated circuit that generates digital temperature information and outputs the digital temperature information to the outside of the semiconductor integrated circuit is described herein.

According to one aspect, a digital temperature information generating apparatus for a semiconductor integrated circuit includes a temperature information generating block that, in response to a reset signal, latches and decodes multiple divided signals obtained by multiple-dividing a second control signal at a timing corresponding to a change in period of a first control signal according to a temperature, and generates temperature information, and pads through which the generated temperature information is output.

According to another aspect, the digital temperature information generating apparatus for a semiconductor integrated circuit can generate digital temperature information itself and output the generated temperature information in an externally usable format. Therefore, it is possible to rapidly meet the changes in the technologies associated with the semiconductor integrated circuit, thereby expanding the useful range of the semiconductor integrated circuit.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
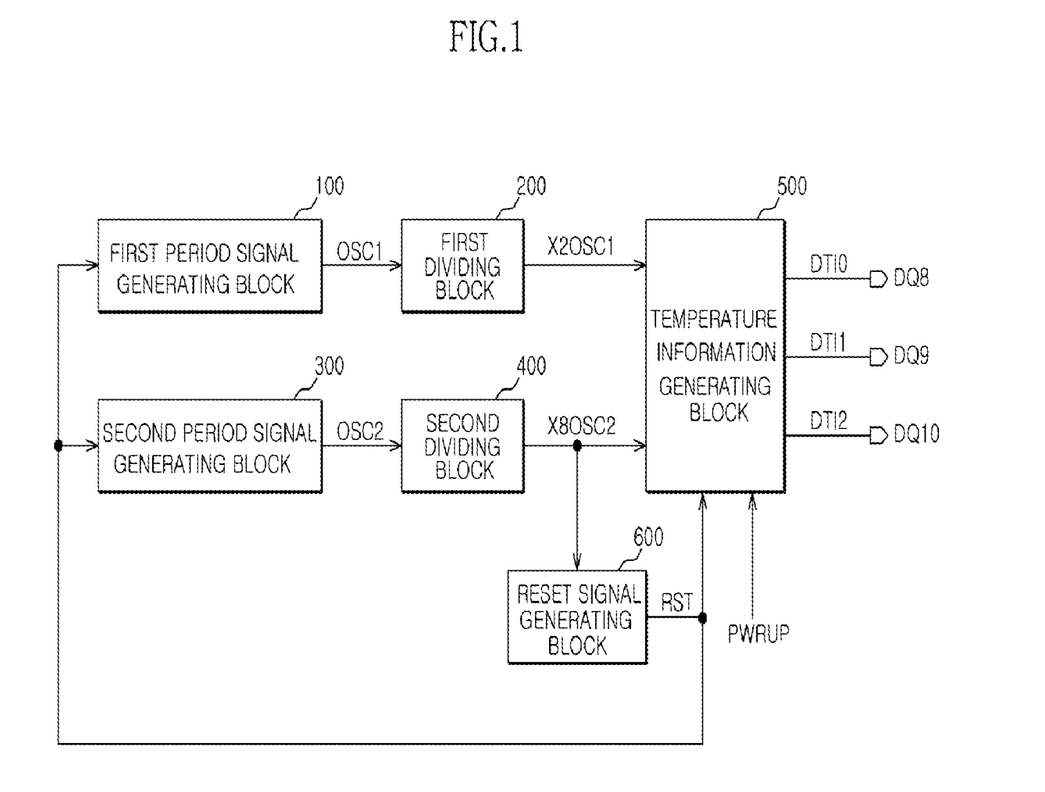
FIG. 1 is a block diagram of a digital temperature information generating apparatus for a semiconductor integrated circuit according to one embodiment.

As shown in FIG. 1, a digital temperature information generating apparatus for a semiconductor integrated circuit according to on embodiment can include a first period signal generating block 100, a first dividing block 200, a second period signal generating block 300, a second dividing block 400, a temperature information generating block 500, and a reset signal generating block 600.

The first period signal generating block 100 can start to operate according to a reset signal 'RST', and can be configured to generate a first period signal 'OSC1', the period of which varies depending on a temperature. The first period signal generating block 100 can include a LTCSR (Linear Temperature Compensated Self Refresh) oscillator.

The first dividing block 200 can be configured to divide the first period signal 'OSC1' by a prescribed division ratio (for example, divides-by-two) and output a first divided period signal 'X2OSC1'.

The second period signal generating block 300 can start to operate according to the reset signal 'RST', and can be configured to generate a second period signal 'OSC2', the period of which is constant regardless of the temperature. The second period signal generating block 300 can include an EMRS (Extended Mode Register Set) oscillator, which generates an EMRS signal.

The second dividing block 400 can be configured to divide the second period signal 'OSC2' by a prescribed division ratio (for example, divides-by-eight) and output a second divided period signal 'X8OSC2'.

The reset signal generating block 600 can include a counter configured to generate the reset signal 'RST' with a prescribed period. The reset signal generating block 600 can be configured to divide the second divided period signal 'X8OSC2' by a prescribed division ratio and generate the reset signal 'RST'.

Figure 2:
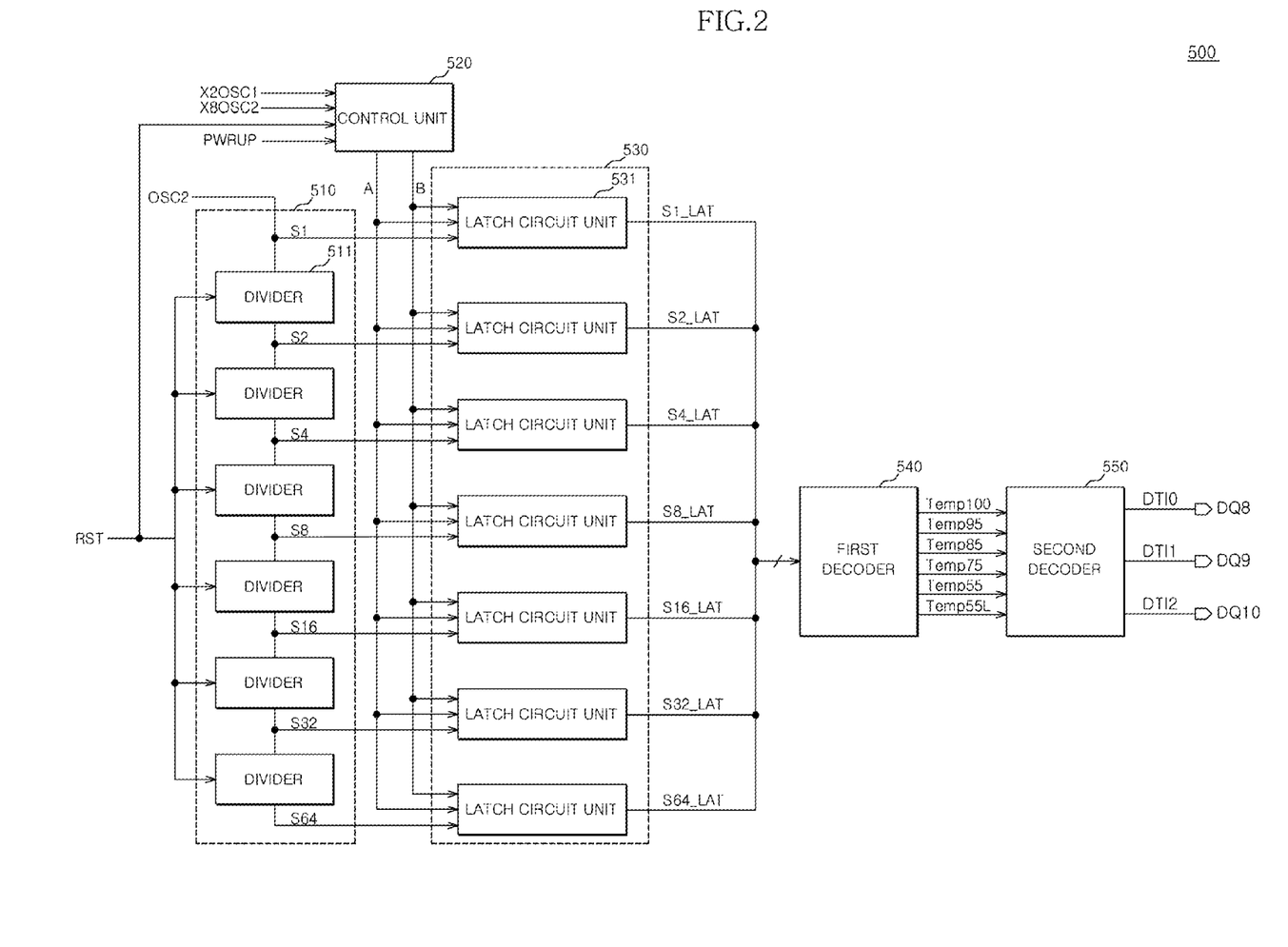
FIG. 2 is a block diagram of a temperature information generating block that can be included in the apparatus shown in FIG. 1.

As shown in FIG. 2, the temperature information generating block 500 can be configured to latch and decode multiple divided signals 'S1' to 'S64' obtained by multiple-dividing the second period signal 'OSC2' at a timing corresponding to a change in period of the first divided period signal 'X2OSC1' according to a temperature to generate temperature information. The temperature information generating block 500 can include a multiple divided signal generating unit 510, a control unit 520, a period latch unit 530, a first decoder 540, and a second decoder 550.

The multiple divided signal generating unit 510 ca can include a plurality of dividers 511 that can receive the second period signal 'OSC2', sequentially divide the second period signal 'OSC2' by a predetermined division ratio X2, and output the divided period signals. The plurality of dividers 511 can each have the same configuration.

The control unit 520 can be configured to generate transmission control signals 'A' and 'B' according to the pulse generation timing of the first divided period signal 'X2OSC1' or the second divided period signal 'X8OSC2'. The control unit 520 can be configured to generate the transmission control signals 'A' and 'B' at a prescribed first level when the reset signal 'RST' is activated, and can allow the period latch unit 530 to receive the multiple divided signals 'S1' to 'S64'. In addition, the control unit 520 can bed configured to generate the transmission control signals 'A' and 'B' at a prescribed second level when the pulse of the first divided period signal 'X2OSC1' or the second divided period signal 'X8OSC2' is generated, and can allow the period latch unit 530 to output the latched multiple divided signals 'S1_LAT' to 'S64_LAT'.

Depending on the embodiment, the control unit 520 can operate with only the first divided period signal 'X2OSC1'. The reason why the second divided period signal 'X8OSC2' is additionally used, in certain embodiments, is as follows: When the first period signal 'OSC1' is used as the standard for determining the self refresh rate, the first period signal 'OSC1' infinitely increases at a specific temperature (for example, 37° C. or less), which in turn causes a refresh failure. Then, to prevent the refresh failure, a cold stopper is provided, such that the period signal according to the EMRS obtained by dividing-by-four the normal period signal is used instead of the first period signal 'OSC1'. Accordingly, the second divided period signal 'X8OSC2' can be used in a case where the temperature is 37° C. or less.

In addition, the reason why the first divided period signal 'X2OSC1' obtained by dividing-by-two the first period signal 'OSC1' is used is that, the larger the division ratio, the more the temperature detection performance is improved. Furthermore, since the first divided period signal 'X2OSC1' obtained by dividing-by-two the first period signal 'OSC1' can be used instead of the first period signal 'OSC1', the second divided period signal 'X8OSC2' obtained by dividing-by-eight the second period signal 'OSC2' can be used instead of the divided-by-four period signal according to the EMRS.

The period latch unit 530 can be configured to latch the multiple divided signals 'S1' to 'S64' according to the transmission control signals 'A' and 'B'. The period latch unit 530 can be configured to block, output, and latch the multiple divided signals 'S1' to 'S64' or receive the multiple divided signals 'S1' to 'S64' in response to the changes of the transmission control signals 'A' and 'B'. The period latch unit 530 can include a plurality of latch circuit units 531 that can commonly receive the transmission control signals 'A' and 'B', and receive the multiple divided signals 'S1' to 'S64' from the plurality of dividers 511. The plurality of latch circuit units 531 can each have the same configuration.

The first decoder 540 can be configured to decode the latched multiple divided signals 'S1_LAT' to 'S64_LAT' in the period latch unit 530 into first digital codes 'Temp100' to 'Temp55L', which define the temperature.

The second decoder 550 can be configured to decode the first digital codes 'Temp100' to 'Temp55L' into 3-bit second digital codes 'DTI0' to 'DTI2' according to the semiconductor memory standards, that is, the JEDEC standards, and output the second digital codes 'DTI0' to 'DTI2' to pads DQ8 to DQ10.

Figure 3:
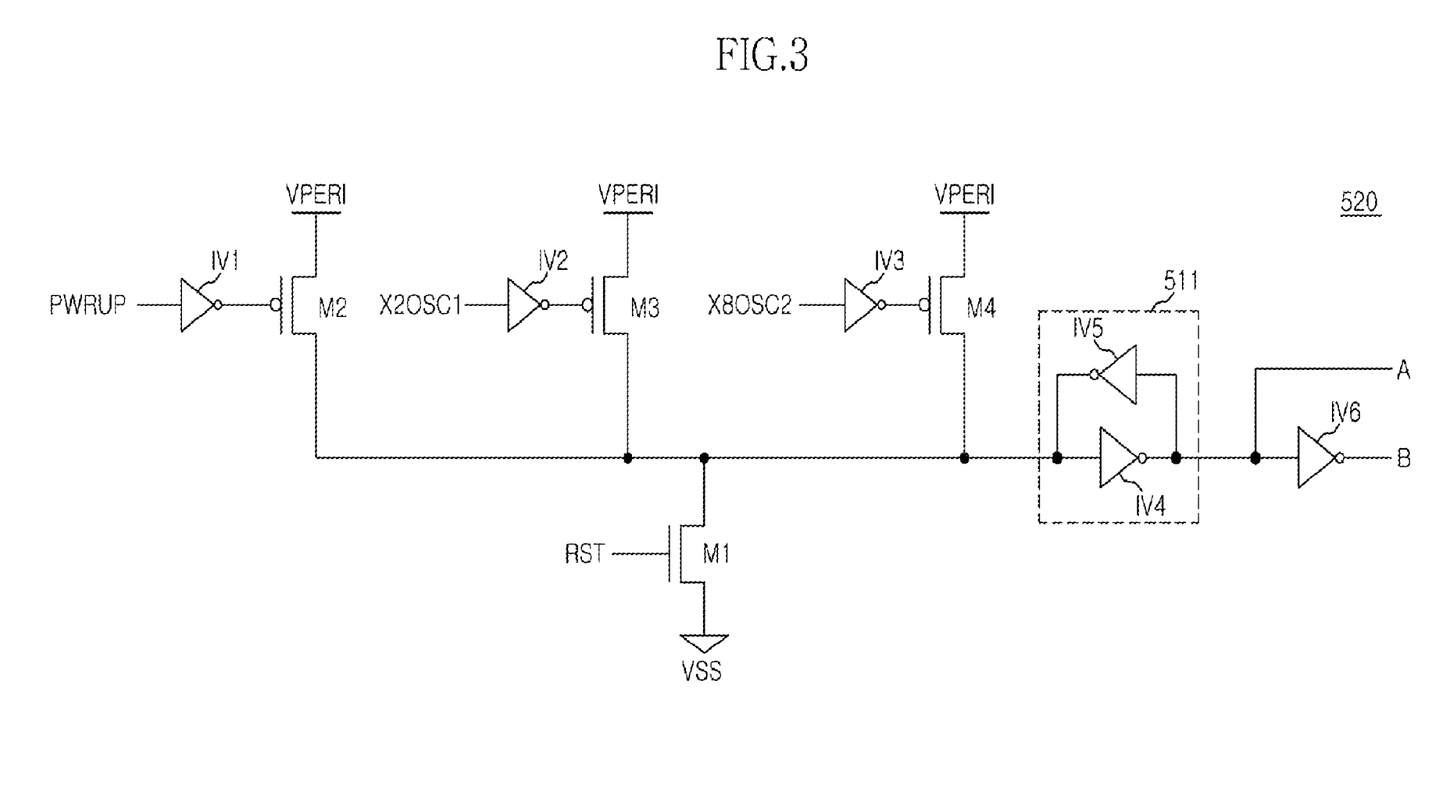
FIG. 3 is a circuit diagram of a control unit that can be included in the temperature information generating block shown in FIG. 2.

As shown in FIG. 3, the control unit 520 can include a plurality of inverters IV1 to IV6, a plurality of transistors M1 to M4, and a latch 521. The transistor M1 can be configured to change the transmission control signals 'A' and 'B' to a first level ('A'=high level and 'B'=low level) in response to the reset signal 'RST'. The inverter IV1 and the transistor M2 can change the transmission control signals 'A' and 'B' to a second level ('A'=low level, 'B'=high level) in response to a power-up signal 'PWRUP'. The inverter IV2 and the transistor M3 can change the transmission control signals 'A' and 'B' to the second level ('A'=low level, 'B'=high level) in response to the first divided period signal 'X2OSC1'. The inverter IV3 and the transistor M4 can change the transmission control signals 'A' and 'B' to the second level ('A'=low level, 'B'=high level) in response to the second divided period signal 'X8OSC2'. The latch 521 and the inverter IV6 can be commonly connected to the drains of the plurality of transistors M1 to M4 so as to maintain the levels of the transmission control signals 'A' and 'B'.

Figure 4:
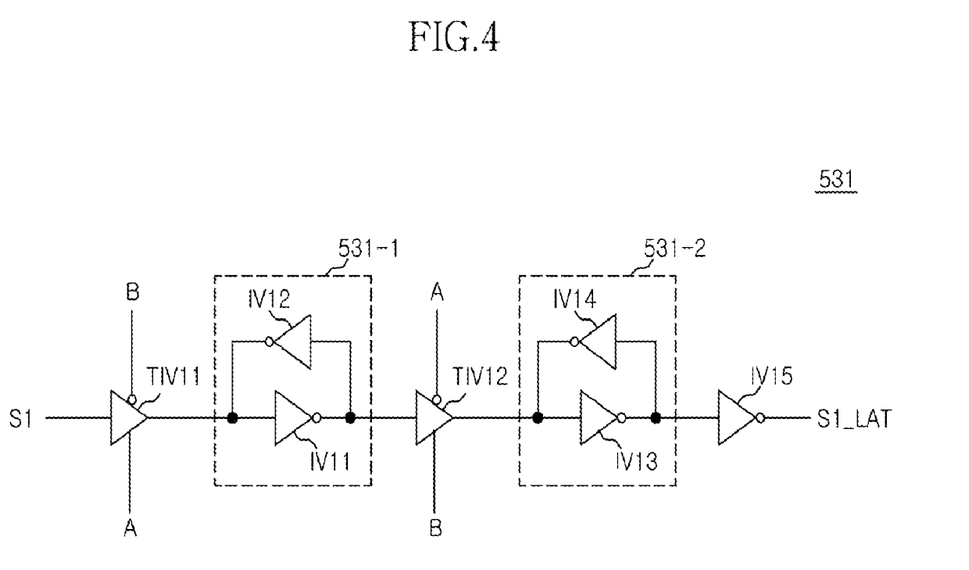
FIG. 4 is a circuit diagram of a period latch unit that can be included in the temperature information generating block shown in FIG. 2.

As shown in FIG. 4, each of the latch circuit units 531 can include a plurality of tri-state inverters TIV11 and TIV12, a plurality of latches 531-1 and 531-2, and an inverter IV15. The tri-state inverter TIV11 can pass the multiple divided signal 'S1' when the transmission control signals 'A' and 'B' are at the first level ('A'=high level, 'B'=low level). The tri-state inverter TIV12 can pass the output of the latch 531-1 when the transmission control signals 'A' and 'B' are at the second level ('A'=low level, 'B'=high level). The latch 531-2 and the inverter IV15 can latch the output of the tri-state inverter TIV12 and output the latched multiple divided signal 'S1_LAT'.

The operation of the digital temperature information generating apparatus for a semiconductor integrated circuit having the above-described configuration will now be described.

Figure 5:
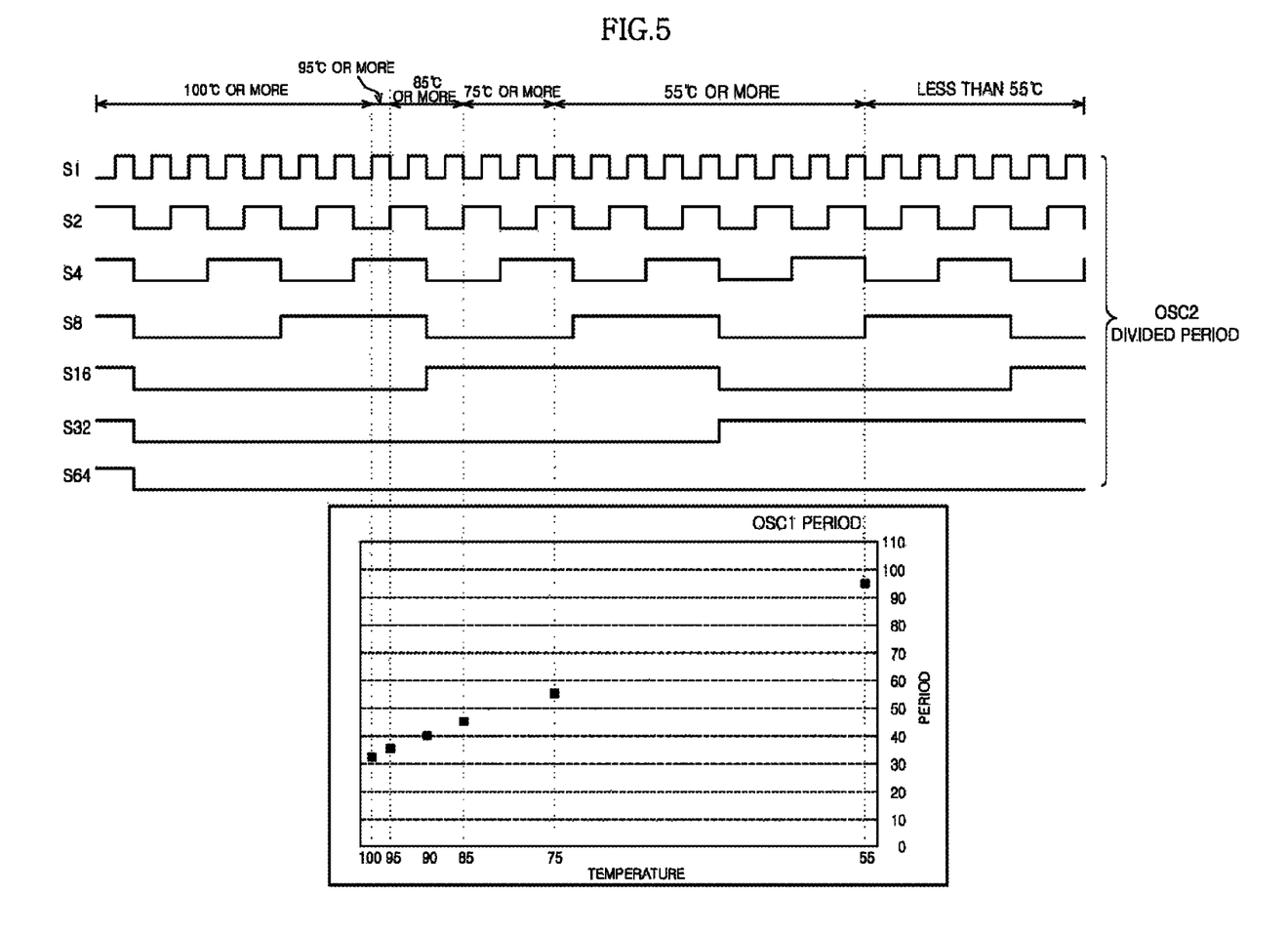
FIG. 5 is a graph showing the period comparison result of a first period signal and a second period signal according to a temperature.

First, the operation will be described with reference to FIGS. 5 and 6.

The period of the first period signal 'OSC1' varies depending on the temperature, and thus the pulse generation timing thereof also varies. FIG. 5 shows a case where the pulse generation timing of the first period signal 'OSC1' is matched with the multiple divided signals 'S1' to 'S64', which are obtained by dividing the second period signal 'OSC2', according to the temperature ranges. The periods of the multiple divided signals 'S1' to 'S64' are constant regardless of the temperature. Accordingly, if the multiple divided signals 'S1' to 'S64' are latched at the pulse generation timing of the first period signal 'OSC1' and the values thereof are read, the values as shown in FIG. 6 are constantly obtained.

Figure 6:
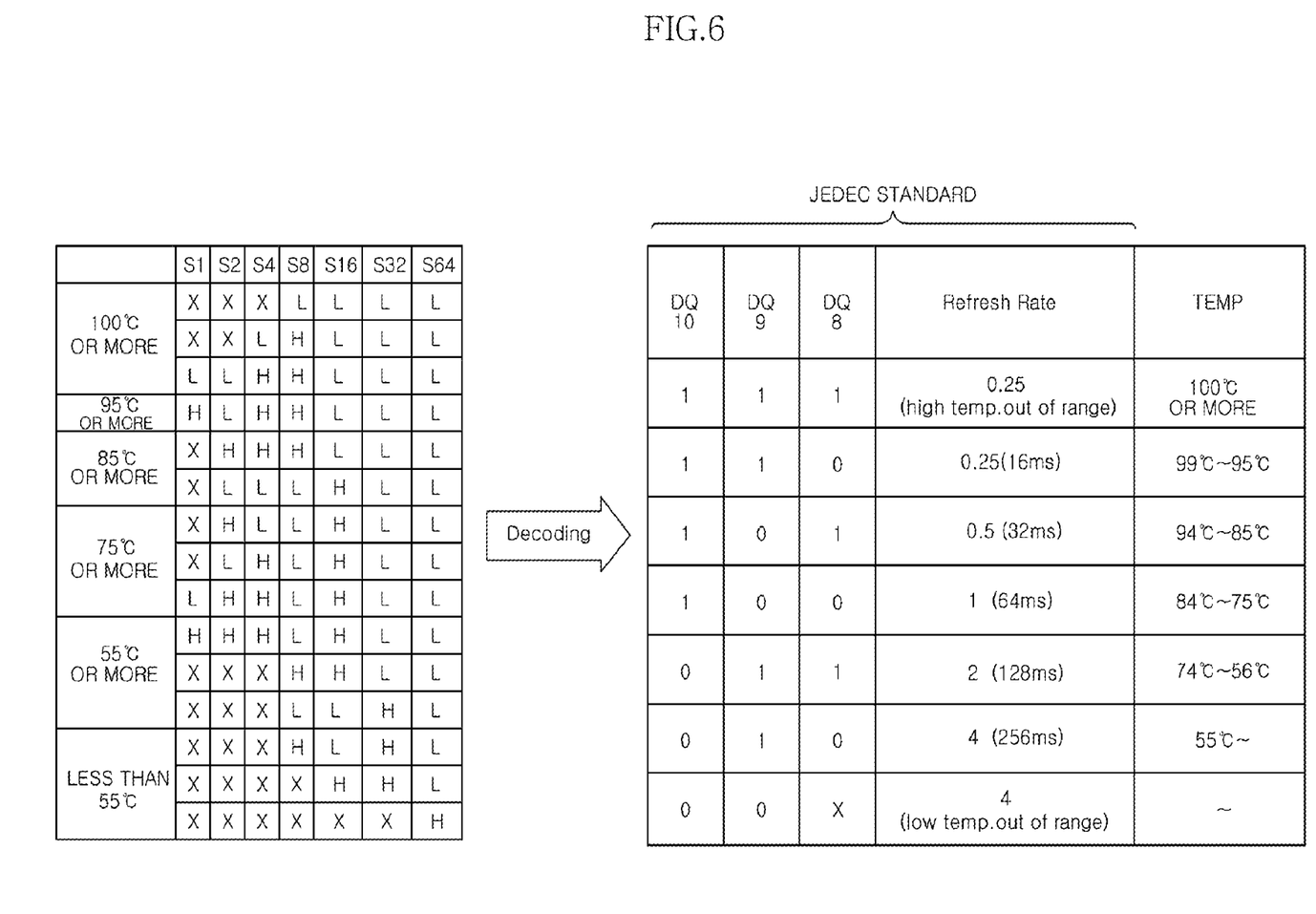
FIG. 6 is a diagram illustrating a temperature information decoding method according to one embodiment.

In the embodiments described herein, the multiple divided signals 'S1' to 'S64' can be latched at the pulse generation timing of the first divided period signal 'X2OSC1', which is obtained by dividing the first period signal 'OSC1', then the latched values are decoded, and subsequently the decoded values are output as the digital temperature information according to the JEDEC standards, as shown in FIG. 6. Referring to FIG. 6, the temperature range does not depend on the JEDEC standards, and it can be set to a predetermined value by a manufacturer.

The operation of the digital temperature information generating apparatus for a semiconductor integrated circuit will now be described.

When the reset signal 'RST' is activated in the reset signal generating block 600, the first period signal generating block 100 and the second period signal generating block 300 start to generate the first period signal 'OSC1' and the second period signal 'OSC2'.

The first dividing block 200 divides the first period signal 'OSC1' and outputs the first divided period signal 'X2OSC1'. The second dividing block 400 divides the second period signal 'OSC2' and outputs the second divided period signal 'X8OSC2'.

The dividers 511 of the temperature information generating block 500 shown in FIG. 2 divide the second period signal 'OSC2' according to the reset signal 'RST' and generate the multiple divided signals 'S1' to 'S64'.

The control unit 520 shown in FIG. 3 changes the transmission control signals 'A' and 'B' to the second level ('A'=low level, 'B'=high level) when the power-up signal 'PWRUP' is activated, and blocks the multiple divided signals 'S1' to 'S64' from the latch circuit units 531 of the period latch unit 530 until the reset signal 'RST' is activated.

The control unit 520 shown in FIG. 3 changes the transmission control signals 'A' and 'B' to the first level ('A'=high level, 'B'=low level) when the reset signal 'RST' is activated, and allows the multiple divided signals 'S1' to 'S64' to be correspondingly input to all of the latch circuit units 531 of the period latch unit 530.

After the reset signal 'RST' is activated, the pulse of the first divided period signal 'X2OSC1' is generated at a predetermined period according to a current temperature.

If the pulse of the first divided period signal 'X2OSC1' is generated, then the control unit 520 changes the transmission control signals 'A' and 'B' to the second level ('A'=low level, 'B'=high level) again.

Referring to FIG. 4, in each of the latch circuit units 531 of the period latch unit 530, for example, the multiple divided signal 'S1' latched in the latch 531-1 passes through the tri-state inverter TIV12 when the transmission control signals 'A' and 'B' are changed to the second level ('A'=low level, 'B'=high level), and is then output as the multiple divided signal 'S1_LAT' through the latch 531-2 and the inverter IV15. Through the same operation, the remaining multiple divided signals S2 to 'S64' are output as the multiple divided signals 'S2_LAT' to 'S64_LAT'.

The first decoder 540 shown in FIG. 2 decodes the latched multiple divided signals 'S1_LAT' to 'S64_LAT' and outputs the first digital codes 'Temp100' to 'Temp55L'. Among the first digital codes 'Temp100' to 'Temp55L', only a code, which falls within a temperature range corresponding to the values of the latched multiple divided signals 'S1_LAT' to 'S64_LAT', is decoded at a high level. For example, if the values of the multiple divided signals 'S1' to 'S64' are X/X/X/L/L/L/L, X/X/L/H/L/L/L, or L/L/H/H/L/L/L, a temperature is 100° C. or more. Then, only the first digital code 'Temp100' among the first digital codes 'Temp100' to 'Temp55L' is decoded at a high level, and the remaining digital codes are decoded at a low level. Among the values of the multiple divided signals 'S1' to 'S64', X means "don't care", L means "low level", and H means "high level".

The second decoder 550 shown in FIG. 2 decodes the first digital codes 'Temp100' to 'Temp55L' into the second digital codes 'DTI0' to 'DTI2' according to the JEDEC standards, and outputs the second digital codes 'DTI0' to 'DTI2'. As shown in FIG. 6, for example, if only the first digital code Temp85 among the first digital codes 'Temp100' to 'Temp55L' is decoded at a high level, then the second digital codes 'DTI0' to 'DTI2' are decoded as "101". In addition, if only the first digital code Temp75 among the first digital codes 'Temp100' to 'Temp55L' is decoded at a high level, then the second digital codes 'DTI0' to 'DTI2' are decoded as "001".

Figure 7:
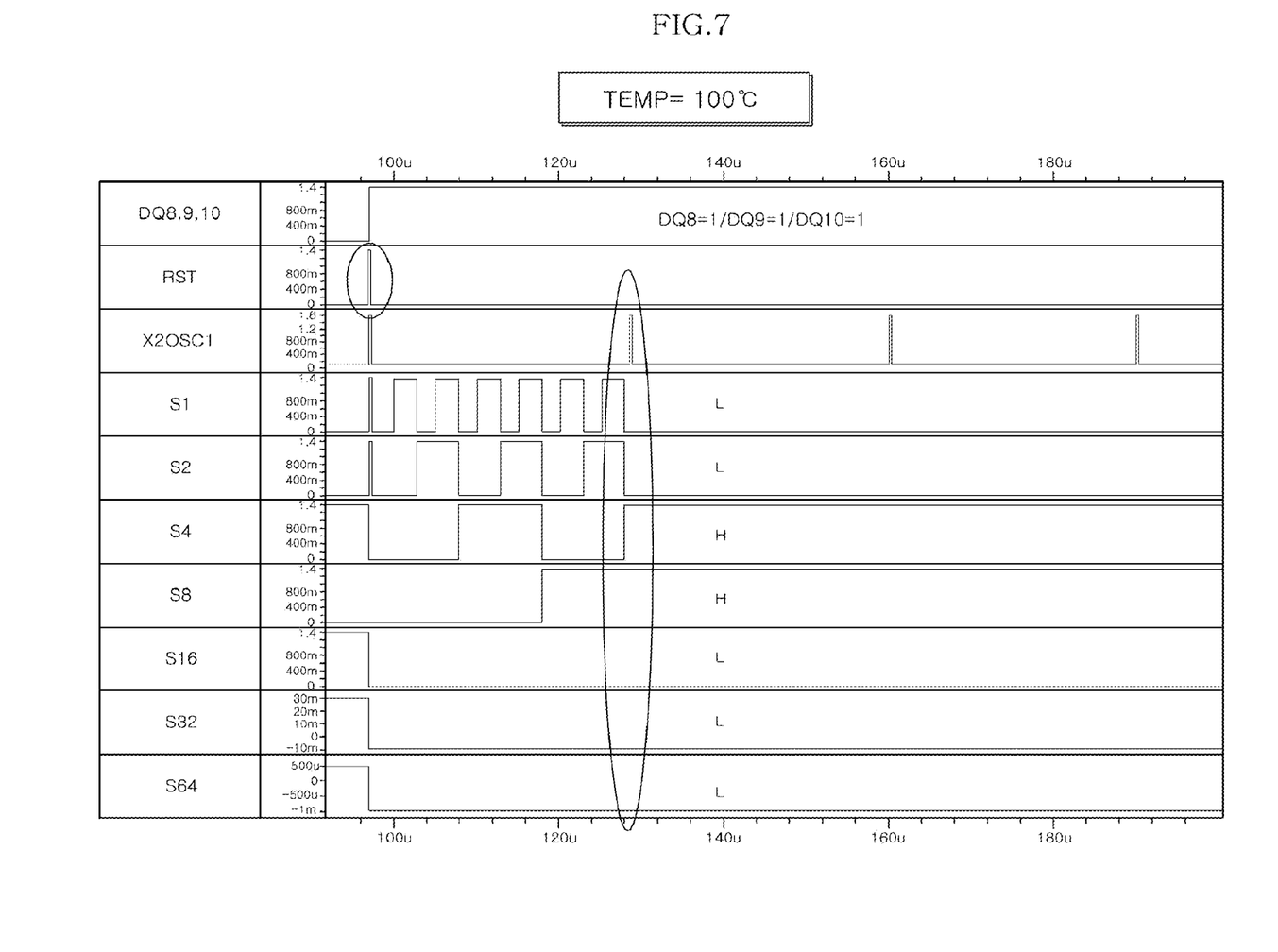
FIGS. 7 and 8 are waveform charts showing the result of a temperature information decoding simulation at a predetermined temperature in FIG. 6.

An actual simulation result at 100° C. is shown in FIG. 7. Referring to FIG. 7, it can be seen that, when the pulse of the first divided period signal 'X2OSC1' is first generated after the reset signal 'RST' is activated, the values of the latched multiple divided signals 'S1' to 'S64' are L/L/H/H/L/L/L, which are the same as the values of the multiple divided signals 'S1' to 'S64' defined in the temperature range of 100° C. or more shown in FIG. 6.

Figure 8:
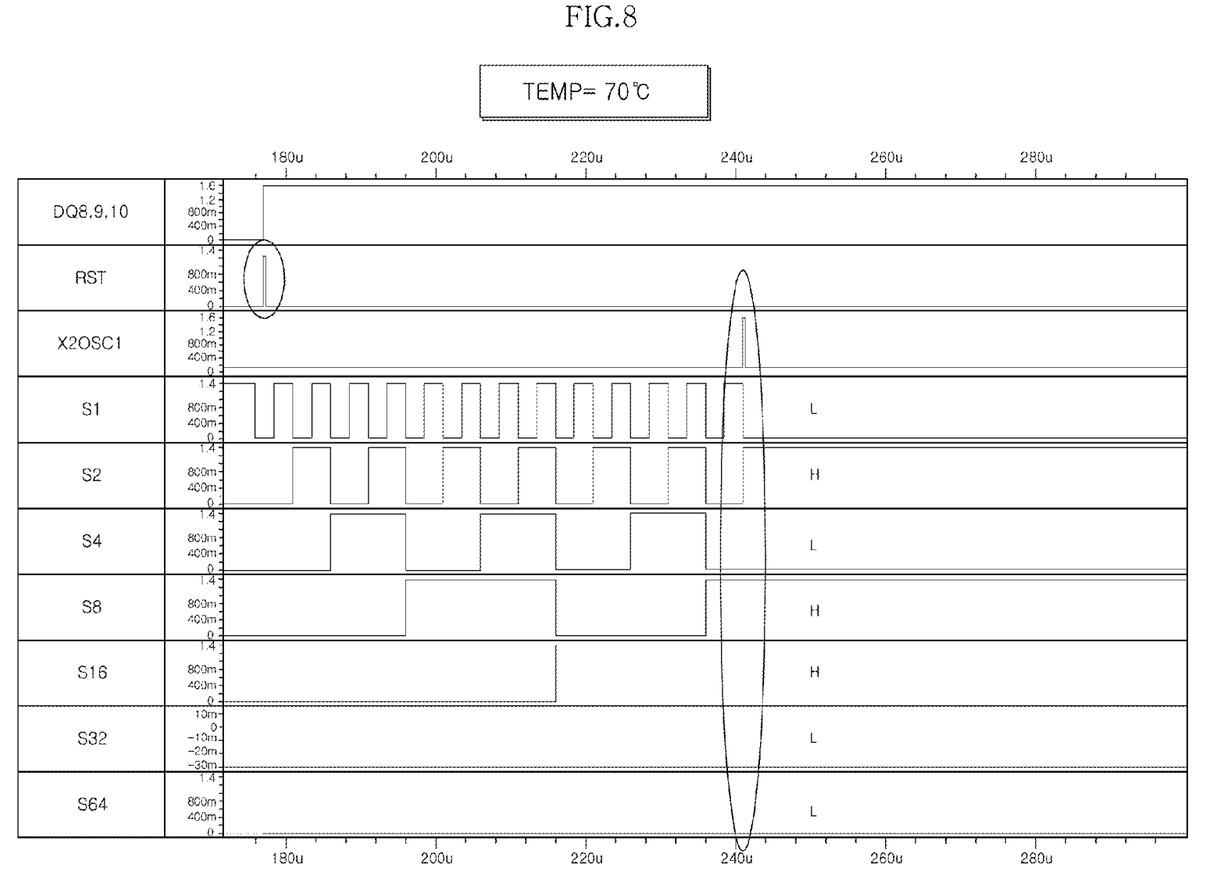

'A' simulation result at 70° C. is shown in FIG. 8. Referring to FIG. 8, it can be seen that, when the pulse of the first divided period signal 'X2OSC1' is first generated after the reset signal 'RST' is activated, the values of the latched multiple divided signals 'S1' to 'S64' are L/H/L/H/H/L/L, which correspond to X/X/X/H/H/L/L as the values of the multiple divided signals 'S1' to 'S64' defined in the temperature range of 55° C. or more shown in FIG. 6.

The second digital codes 'DTI0' to 'DTI2' generated in the above-described manner are output as the digital temperature information through the pads DQ8 to DQ10. Then, a memory controller, for example, a GPU (Graphic Processing Unit), can use the digital temperature information to determine the auto refresh rate.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A digital temperature information generating apparatus for a semiconductor integrated circuit, comprising:
   a first oscillator configured to generate a first control signal;
   a second oscillator configured to generate a second control signal;
   a reset signal generating block configured to generate a reset signal in response to the second control signal;
   a temperature information generating block configured to latch and decode multiple divided signals obtained by multiple-dividing the second control signal at a timing corresponding to a change in period of the first control signal according to a temperature in response to the reset signal, and generate temperature information; and
   pads coupled with the temperature information generating block through which the generated temperature information is output.

2. The digital temperature information generating apparatus of claim 1, wherein the period of the first control signal varies depending on the temperature, and the period of the second control signal is constant regardless of the temperature.

3. The digital temperature information generating apparatus of claim 2, wherein the first control signal is generated by use of an LTCSR (Linear Temperature Compensated Self Refresh) oscillator.

4. The digital temperature information generating apparatus of claim 2, wherein the second control signal is generated by use of an EMRS (Extended Mode Register Set) oscillator.

5. The digital temperature information generating apparatus of claim 1, wherein the temperature information generating block includes:
   a multiple divided signal generating unit configured to generate the multiple divided signals using the second control signal;
   a control unit configured to generate a transmission control signal according to a pulse generation timing of the first control signal;
   a period latch unit configured to latch the multiple divided signals according to the transmission control signal; and
   a decoding unit configured to decode the latched multiple divided signals in the period latch unit and generate the temperature information.

6. The digital temperature information generating apparatus of claim 5, wherein the multiple divided signal generating unit includes: a plurality of dividers, each of the plurality of dividers configured to sequentially divide the second control signal at individual division ratios, and output the divided signals.

7. The digital temperature information generating apparatus of claim 6, wherein the division ratios of the plurality of dividers are the same.

8. The digital temperature information generating apparatus of claim 5, wherein the control unit initializes the transmission control signal in response to the reset signal and changes the level of the transmission control signal in response to the first control signal.

9. The digital temperature information generating apparatus of claim 8, wherein the control unit includes:
   a first switching element configured to change the transmission control signal to a first level in response to the reset signal;
   a second switching element configured to change the transmission control signal to a second level in response to a power-up signal; and
   a third switching element configured to change the transmission control signal to the second level in response to the first control signal.

10. The digital temperature information generating apparatus of claim 9, wherein the control unit further includes: a latch that is commonly connected to an output terminal of the first switching element, an output terminal of the second switching element, and an output terminal of the third switching element.

11. The digital temperature information generating apparatus of claim 5, wherein the control unit is configured to initialize the transmission control signal in response to the reset signal and change the level of the transmission control signal in response to the first control signal or the second control signal.

12. The digital temperature information generating apparatus of claim 11, wherein the control unit includes:
   a first switching element configured to change the transmission control signal to a first level in response to the reset signal;
   a second switching element configured to change the transmission control signal to a second level in response to a power-up signal;
   a third switching element configured to change the transmission control signal to the second level in response to the first control signal; and
   a fourth switching element configured to change the transmission control signal to the second level in response to the second control signal.

13. The digital temperature information generating apparatus of claim 12, wherein the control unit further includes: a latch that is commonly connected to an output terminal of the first switching element, an output terminal of the second switching element, an output terminal of the third switching element, and an output terminal of the fourth switching element.

14. The digital temperature information generating apparatus of claim 5, wherein the period latch unit is configured to block and latch the multiple divided signals or receive the multiple divided signals in response to the change of the transmission control signal.

15. The digital temperature information generating apparatus of claim 14, wherein the period latch unit includes:
   a plurality of latch circuit units that commonly receive the transmission control signal, and receive the multiple divided signals from the plurality of dividers.

16. The digital temperature information generating apparatus of claim 15, wherein each of the latch circuit units includes:
   a first switching element configured to pass the multiple divided signals in response to the transmission control signal;
   a first latch configured to latch the output of the first switching element;
   a second switching element configured to pass the output of the first latch in response to an inverted transmission control signal; and
   a second latch configured to latch the output of the second switching element.

17. The digital temperature information generating apparatus of claim 5, wherein the decoding unit includes:
   a first decoder configured to decode the latched multiple divided signals in the period latch unit into first digital codes defining temperature; and
   a second decoder configured to decode the first digital codes output from the first decoder into second digital codes according to the semiconductor memory standards.

18. The digital temperature information generating apparatus of claim 1, further comprising: a dividing block configured to divide at least one of the first control signal and the second control signal.

19. The digital temperature information generating apparatus of claim 1, wherein at least one of the first control signal and the second control signal starts to be generated according to the reset signal.

20. The digital temperature information generating apparatus of claim 1, further comprising: a reset signal generating block configured to generate the reset signal on the basis of the second control signal.

* * * * *